United States Patent
Chen et al.

(10) Patent No.: US 7,518,207 B1
(45) Date of Patent: Apr. 14, 2009

(54) MOLECULAR BEAM EPITAXY GROWTH OF TERNARY AND QUATERNARY METAL CHALCOGENIDE FILMS

(75) Inventors: Yuanping Chen, North Potomac, MD (US); Gregory Brill, Germantown, MD (US); Nibir K. Dhar, Herndon, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 69 days.

(21) Appl. No.: 10/807,714

(22) Filed: Mar. 19, 2004

(51) Int. Cl.
*H01L 31/00* (2006.01)

(52) U.S. Cl. ............... 257/442; 257/614; 257/E31.015

(58) Field of Classification Search .................. 257/78, 257/200, 442, 614, E21.068, E31.008, E31.015
See application file for complete search history.

(56) References Cited

U.S. PATENT DOCUMENTS

| | | | |
|---|---|---|---|
| 5,306,386 A | | 4/1994 | de Lyon |
| 5,399,206 A | | 3/1995 | de Lyon |
| 5,449,927 A | * | 9/1995 | Hamilton et al. ............ 257/188 |
| 5,742,089 A | * | 4/1998 | Rajavel et al. .............. 257/442 |
| 6,208,005 B1 | * | 3/2001 | Mitra .......................... 257/442 |
| 7,056,471 B1 | * | 6/2006 | Han et al. .................... 420/523 |
| 7,067,008 B2 | * | 6/2006 | Kazandjian et al. ........... 117/19 |

OTHER PUBLICATIONS

Chen et al., "MBE growth of CdSeTe/Si composite substratge for long wavelength IR HgCdte applications" Journal of Crystal Growth 252 (2003) 270-284.*

* cited by examiner

*Primary Examiner*—Tuan N. Quach
(74) *Attorney, Agent, or Firm*—Edward L. Stolarun; William V. Adams; Lawrence E. Anderson

(57) ABSTRACT

The ternary alloy $CdSe_xTe_{1-x}(2\ 1\ 1)$ and the quaternary alloy $Cd_{1-z}Zn_zSe_xTe_{1-x}$ have been grown on $Si(2\ 1\ 1)$ substrates using molecular beam epitaxy (MBE). The growth of CdSeTe is facilitated using a compound CdTe effusion source and a Se effusion source while the growth of CdZnSeTe is facilitated using a compound CdTe effusion source, a compound ZnTe effusion source, and an elemental Se source. The alloy compositions (x) and (z) of $CdSe_xTe_{1-x}$ ternary compound and $Cd_{1-z}Zn_zSe_xTe_{1-x}$ are controlled through the Se/CdTe and ZnTe/CdTe flux ratios. The rate of Se incorporation is higher than the rate of Te incorporation as growth temperature increases. As-grown CdSeTe with 4% Se and CdZnSeTe with 4% Zn+Se, which is substantially lattice matched to long-wavelength infrared HgCdTe materials, exhibits excellent surface morphology, low surface defect density (less than 500 $cm^2$), and a narrow X-ray rocking curve (a full-width at half maximum of 103 arcsec).

13 Claims, 7 Drawing Sheets

MOLECULAR BEAM EPITAXY GROWTH OF TERNARY AND QUATERNARY METAL CHALCOGENIDE FILMS

GOVERNMENT INTEREST

The invention described herein may be manufactured, used, and licensed by or for the United States Government.

FIELD OF THE INVENTION

The present invention generally relates to the growth of $CdSe_xTe_{1-x}$ and $Cd_{1-z}Zn_zSe_xTe_{1-x}$ and in particular to the epitaxial growth of $CdSe_xTe_{1-x}$ and $Cd_{1-z}Zn_zSe_xTe_{1-x}$ on silicon.

BACKGROUND OF THE INVENTION

For over a decade, the HgCdTe research community has spent considerable effort to prepare CdTe/Si composite substrates for HgCdTe material growth and subsequent infrared (IR) device applications. These research efforts have led to a relatively mature process for CdTe/Si fabrication by MBE. CdTe/Si composite substrates have been used to fabricate large-format short wavelength infrared (SWIR, 1-3 μm) and medium wavelength infrared (MWIR, 3-5 μm) HgCdTe focal plane arrays, despite the lattice mismatch between CdTe and HgCdTe.

However, to advance this technology to long wavelength (LWIR, 8-12 μm) HgCdTe devices, lattice matching to HgCdTe is needed in order to reduce the dislocation density within the material. This is specifically necessary for LWIR material since an elevated dislocation density has a greater impact on device performance in the LWIR limit than in either MWIR or SWIR regions due to the inherently smaller band gap of long wavelength detecting HgCdTe material. To mitigate the lattice mismatch issue, initial efforts have focused on incorporating 4.3% Zn into the CdTe/Si layer to provide $Cd_{0.957}Zn_{0.043}Te/Se$ composite substrates which are exactly lattice matched to LWIR HgCdTe. However, it is difficult to growth CdZnTe layers of suitable crystal quality and low defect levels on Si. Furthermore, the crystalline structure of $Cd_{1-z}Zn_zTe$ degrades for increasing values of z, perhaps due to a miscibility gap.

The II-VI compounds, using nomenclature common in the literature, include group II atoms (such as cadmium (Cd), zinc (Zn), and mercury (Hg)) in compounds formed with group VI atoms (such as sulfur (S), selenium (Se), and tellurium (Te)). These compounds are often semiconducting. Binary compounds include CdTe, CdSe, CdS, ZnTe, and the like. CdTe, for example, is sometimes referred to as cadmium telluride, with analogous nomenclature for other compounds. This nomenclature is not intended to indicate any particular electronic state of the group II or group VI (chalcogenide) atoms within the compound, or to suggest any other compound property. CdTe is sometimes also referred to as an alloy of cadmium and tellurium. The term alloy, in this context, does not suggest any particular property of the compound, and is only used to indicate that the compound includes the given atomic species.

Ternary II-VI compounds include compounds having two group II atomic species and one group VI atomic species, such as HgCdTe (mercury cadmium telluride, or MCT), and compounds having one group II atomic species and two group VI atomic species, such as CdSeTe. Generally, a term such as HgCdTe is used to represent a class of compounds having the general formula $Hg_{1-y}Cd_yTe$, where $0<y<1$, sometimes written (Hg,Cd)Te. Quaternary II-VI compounds include CdZnSeTe, HgCdSeTe, and other such compounds.

U.S. Pat. Nos. 5,306,386 and 5,399,206, both to de Lyon, disclose growth of a ternary or quaternary II-VI semiconductor layer on a silicon (Si) substrate having an arsenic monolayer coating. U.S. Pat. No. 6,045,614, also to be Lyon, discloses epitaxial growth of CdZnTe(1 1 1) on a silicon substrate having a (1 1 1) orientation tilted 2-8 degrees away from the surface normal.

However, the prior art fails to disclose the MBE growth of high quality CdSeTe and CdZnSeTe films on a silicon based substrate, having low surface defect density and potential lattice matching to HgCdTe. In this context, a silicon based substrate is a substrate including a silicon layer, such as a silicon wafer, a passivated Si layer, or a Si layer supporting one or more further layers, such as ZnTe, CdTe and/or CdSeTe and or CdZnSeTe. There exists a need for high-quality CdSeTe or CdZnSeTe composite materials that are lattice matched to $Hg_{1-y}Cd_yTe$ in the alloy composition a range $0 \leq y \leq 1$.

SUMMARY OF THE INVENTION

The ternary alloy $CdSe_xTe_{1-x}(2\ 1\ 1)$ and quaternary $Cd_{1-z}Zn_zSe_xTe_{1-x}$ have been grown on $Si(2\ 1\ 1)$ substrates using molecular beam epitaxy as prototypical of $CdX_xX'_{1-x}$ or $Cd_{1-z}X_xX'_{1-x}$ where X and X' are different chalcogenidies from the array of S, Se and Te and X is the lower atomic number chalcogenide. The growth of CdSeTe is facilitated by the usage of a compound CdTe effusion source and a Se effusion source and the growth of CdZnSeTe is facilitated by the usage of a compound ZnTe effusion source, a compound CdTe effusion source, and a Se effusion source. The alloy composition (x) of $CdX_xX'_{1-x}$ ternary compound and compositions (x, z) of the quaternary compound are controlled through the X/CdX' and ZnX'/CdX' flux ratio.

CdSeTe is grown on Si at different growth temperatures. The rate of Se incorporation tends to be higher than the rate of Te incorporation, particularly sa the growth temperature is increased. As-grown CdSeTe with a 4% Se content ($CdSe_{0.04}Te_{0.96}$) exhibited excellent surface morphology, low surface defect density (less than 500 cm$^{-2}$) and a low X-ray double crystal rocking curve (DCRC) full-width at half maximum (FWHM) of 103 arcsec or better. As-grown CdZnSeTe layer with 4% of Zn+Se contents exhibited excellent surface morphology, low surface defect density (less than 500 cm$^{-2}$) and low X-ray DCRC FWHM of 101 arcsec. These compositions are lattice matched to long-wavelength infrared (LWIR) HgCdTe material, allowing fabrication of improved IR detectors and other devices.

The other ternary and quaternary cadmium chalcogenides CdSTe, CdSSe, CdZnSTe, CdZnSSe can also be produced as epitaxial films on substrates according to the present invention. As used herein, the stated percentage of a particular chalcogenide atom in a ternary compound having two chalcogenide atomic species (such as CdSeTe) is determined by the relative numbers of atoms of each chalcogenide species in the compound. For example, $CdSe_{0.05}Te_{0.95}$ is equivalent to CdSeTe having an atomic stoichiometry of 5% Se or 95% Te and $Cd_{0.99}Zn_{0.01}Se_{0.03}Te_{0.97}$ is equivalent to CdZnSeTe with 1% of Zn relative to Cd and 3% of Se relative to Te. The term "CdSeTe" or "CdZnSeTe" is used herein to represent compounds having the general formula $CdSe_xTe_{1-x}$, where $0<x<1$, or $Cd_{1-z}Zn_zSe_xTe_{1-x}$, where $0<x<1$ and $0 \leq z<1$ the variables x and z are sometimes expressed as a percentage between 0 and 100.

Silicon based substrates are substrates including a silicon layer, and include composite substrates such as CdTe/Se, ZnTe/Si, and substrates including CdSeTe or CdZnSeTe films grown on silicon. A CdSeTe/CdTeSi, CdZnSeTe/CdTe/Si, CdSeTe/Si or CdZnSeTe/Si structure is operative as a silicon based composite substrate for growth of HgCdTe.

DESCRIPTION OF THE PREFERRED EMBODIMENTS

Figure 1:
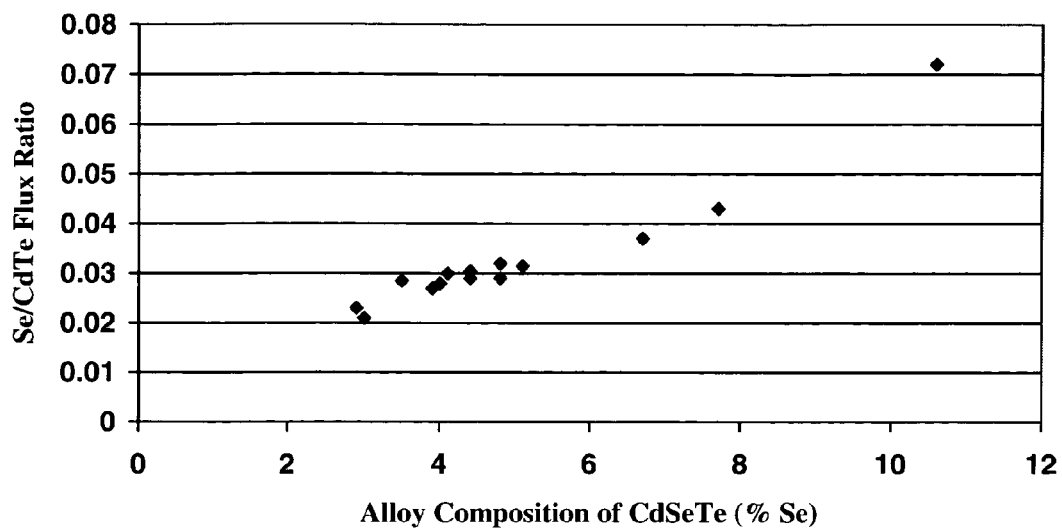
FIG. 1 is a plot of the Se concentration CdSeTe alloy as a function of Se/CdTe flux ratio.

The present invention has utility in infrared communication, infrared sensor and infrared imaging device construction. While the present invention is detailed herein with respect to $CdSe_xTe_{1-x}$ and $Cd_{1-z}Zn_zSe_xTe_{1-x}$, it is appreciated that the exemplary teachings for these specific ternary and quaternary cadmium chalcogenides are readily extended to $CdS_xTe_{1-x}$, $Cd_{1-z}Zn_zS_xSe_{1-x}$ and $Cd_{1-z}Zn_zS_xTe_{1-x}$.

As used herein, the stated percentage of a particular chalcogenide atom in a ternary compound having two chalcogenide atomic species such (such as CdSeTe) is determined by the relative numbers of atoms of each chalcogenide species in the compound. For example, $CdSe_{0.05}Te_{0.95}$ is equivalent to CdSeTe having an atomic stoichiometry of 5% Se or 95% Te and $Cd_{0.99}Zn_{0.01}Se_{0.03}Te_{0.97}$ is equivalent to CdZnSeTe with 1% of Zn relative to Cd and 3% of Se relative to Te. The term "CdSeTe" or "CdZnSeTe" is used herein to represent compounds having the general formula $CdSe_xTe_{1-x}$, where 0<x<1, or $Cd_{1-z}Zn_zSe_xTe_{1-x}$, where 0<x<1 and 0<z<1 the variables x and z are sometimes expressed as a percentage between 0 and 100.

A $CdX_xX'_{1-x}$ or $Cd_{1-z}Zn_zX_xX'_{1-x}$ is grown on a substrate according to the present invention where X and X' are different chalcogenides from among S, Se and Te. Preferably, the substrate for film growth according to the present invention is silicon, although it is appreciated that other substrates illustratively including GaAs, Ge and InSb are operative herein. More preferably, the substrate is Si(2 1 1). Generally, x+z is less than 0.10. Depending on the specific film composition and subsequent layers that are to be lattice matched, x+z generally assumes a value between 0.01 and 0.10. More preferably, x+z is between 0.01 and 0.08. In the particular instance of lattice matching, $Cd_{1-z}Zn_zSe_xTe_{1-x}$ to HgCdTe, x+z is between 0.03 and 0.05; optimal lattice match is found at x+z=0.04 relative to $Hg_{1-y}Cd_yTe$ where y is between 0.15 and 0.30 and preferably about 0.22. As used herein "substantial lattice matching" is defined to be the lattice constant of the substrate or composite substrate which is matched to that of the epilayer grown on top of the substrate. The silicon based substrate is preferably Si(2 1 1) orientated buffered with CdX or CdX'. This system constitutes a growth substrate for an inventive CdXX' or CdZnXX' film. It is appreciated that chalcogenide multi-layers, monolayers and submonolayer films are also operative herein as growth templates for inventive CdXX' or CdZnXX' film. Preferably, an inventive CdXX' or CdZnXX' film with a surface defect density is produced according to the present invention of equal to or less than 2000 per centimeter squared. More preferably, the surface defect density is less than 500 per centimeter squared.

An inventive CdXX' or CdZnXX' epitaxial film is grown on a template layer by molecular beam epitaxy from multiple material source combinations including: CdX', ZnX', X; Cd, Zn and CdX, ZnX, X' where X and X' are different chalcogenides and each of X and X' is S, Se or Te and X has a lower atomic number than X'. During the course of epitaxial film growth of CdXX' or CdZnXX' the growing film is optionally flash annealed, which is defined as heating the sample to a temperature greater than the growth temperature under the appropriate CdX, ZnX, CdX', ZnX', X and/or X' fluxes. In controlling an inventive CdXX' or CdZnXX' layer stoichiometry, the flux from each of the multiple material sources is controlled consistent with the competitive addition rates under a given set of epitaxial growth conditions including temperature. By way of nonlimiting theory, it is believed that the binding energy of CdX decreases as X changes from S to Se to Te, since published values for the heats of formation follow similarly. Simultaneously, the heats of atomization decrease moving from S to Te. As a result, incorporation of the lower atomic number chalcogenides tends to require higher fluxes to achieve a given stoichiometry.

Growth of $CdSe_xTe_{1-x}$ $Cd_{1-z}Zn_zSe_xTe_{1-x}$ on Si is conducted using a DCA MBE system (DCA Instruments, Turku, Finland) equipped with a 3.25-inch substrate heater. This growth process is also applicable using other brands of MBE systems. Three-inch Si(2 1 1) nominal wafers are used as substrates. All Si wafers are cleaned using the modified RCA process. This procedure is based on the RCA process (W. Kern and D. A. Puotinen, RCA Rev. 31, 187 (1970)) with modifications described in J. Electron, Mater., 22, 1306 (1993). Other Si surface cleaning procedures, such as passivation with hydrogen atoms/molecules, were also used. Wafer cleaning is well known in the art; see for example the "Handbook of Semiconductor Wafer Cleaning Technology" by Werner Kern (Noyes Publications, 1993).

The RCA cleaning process leaves an approximate 12 Å uniform oxide layer on the Si surface, which is thermally removed in the growth chamber. For these experiments, the samples are quickly heated to 1050° C. to remove the oxide layer and then quickly cooled under an $As_4$ flux to 500° C. Finally, the sample is cooled to the nucleation temperature of 340° C. without any flux. All temperatures stated are the reading of a thermocouple located approximately 10 mm from the back of the substrate, which provided excellent run-to-run reproducibility.

For the growth of CdTe, CdSeTe or CdZnSeTe on Si(2 1 1) substrate, arsenic passivation is used to obtain a high quality epilayer along the (2 1 1)B orientation. Since CdTe, CdSeTe or CdZnSeTe(2 1 1) are polar surfaces, these surfaces terminate with either Te atoms (called B face or non-metal face), or Cd atoms (called A face or metal face). CdTe(2 1 1)B face is preferred is CdTe is used as a composite substrate for the growth of HgCdTe, CdZnSeTe or CdSeTe.

It is appreciated that other methods for minimizing or eliminating oxide growth on the surface after cleaning are operative herein, as are known in the art, for example as described in U.S. Pat. No. 6,620,743 to Pagliaro et al.

After the oxide layer is removed and the sample is passivated with As, a crystalline CdTe layer is grown having a thickness of at least one micron. Preferably, the CdTe film has a thickness of from at least 3 to 10 microns. This process starts with a seedling layer of thin ZnTe deposited at 340° C. on the Si substrate utilizing migration-enhanced epitaxy (MEE) with elemental Zn and Te sources. After annealing the ZnTe layer at 490° C. under Te flux for 20 min, a thick (3-10 microns) CdTe layer is grown using a CdTe compound source. The growth rate of CdTe is approximately 0.75 micron $h^{-1}$. Periodically, during crystalline CdTe growth, the layer is rapidly annealed to 530° C. under a Te overpressure. This type of flash annealing is used to improve the CdTe layer quality. Finally, $CdSe_xTe_{1-x}$ or $Cd_{1-x}Zn_zSe_xTe_{1-x}$ is grown on top of the CdTe layer using the CdTe and ZnTe (for quaternary CdZnSeTe) compound sources and an elemental Se source. No annealing sequences are required during the CdSeTe or CdZnSeTe growth. However, it is appreciated that the flash annealing sequences are optionally applied to the growth of CdSeTe or CdZnSeTe for better film quality. During the growth of CdTe and CdSeTe or CdZnSeTe, the growth temperatures are independently adjusted, preferably, kept between 300° C. and 450° C. More preferably, the growth temperatures should be between 320° C. and 380° C. For most of the cases, the CdTe and CdSeTe or CdZnSeTe temperatures are kept identical.

As-grown $CdSe_xTe_{1-x}$ and $Cd_{1-z}Zn_zSe_xTe_{1-x}$ layers are evaluated utilizing X-ray rocking curve measurements in order to gauge the overall crystalline quality. Additionally, X-ray diffraction allows for calculation of the composition of the CdSeTe layer be determining the offset of the CdSeTe peak with respect to the position of the CdTe peak and assuming a linear relationship between alloy composition and $CdSe_xTe_{1-x}$ lattice constant. Such a linear relationship has been confirmed for $CdSe_xTe_{1-x}$ polycrystalline films deposited on glass using electron beam evaporation (R. Islam, H. D. Banerjee and D. R. Rao, Thin Solid Films, 266, (1995) 215). Based on these assumptions, a composition $CdSe_{0.04}Te_{0.96}$ is needed to achieve lattice matching with LWIR $Hg_{0.78}Cd_{0.22}Te$. In a similar fashion, overall alloy composition of z+x of the quaternary $Cd_{1-z}Zn_zSe_xTe_{1-x}$ is calculated based on the offset of the CdZnSeTe peak with respect to the position of the CdTe peak.

To properly control the Se concentration of CdSeTe layer and Zn and Se concentrations of CdZnSeTe layer, careful flux measurements of the Se source, the ZnTe source and the CdTe source are made prior to each MBE growth run using a retractable ion gauge placed in the sample growth position.

Referring now to the figures, FIG. 1 shows that the Se concentration in CdSeTe follows quite linearly with the flux ratio of Se to CdTe. A range of CdSeTe layer compositions are readily grown according to the present invention in order to gauge material characteristics with respect to Se composition. In general, a broadening of X-ray full-width at half-maximum (FWHM) of the CdSeTe layers is observed from 70 to 230 arcsec as the Se concentration increases from 0% to 10%, respectively. From this measurement, it appears that the alloy disordering is much less severe in CdSeTe alloys than in the CdZnTe alloy. This significant advantage of CdSeTe is not disclosed in the prior art.

In order to study the Se incorporation in CdTe layers and to optimize the growth conditions for CdSeTe on Si, the growth of CdSeTe on CdTe/ZnTe/Si is investigated at temperatures ranging from 300° C. to 440° C. The as-grown CdSeTe/CdTe/ZnTe/Si layers are evaluated by X-ray diffraction and optical microscopy to determine the crystalline quality, alloy composition, surface morphology and surface defects.

Figure 2:
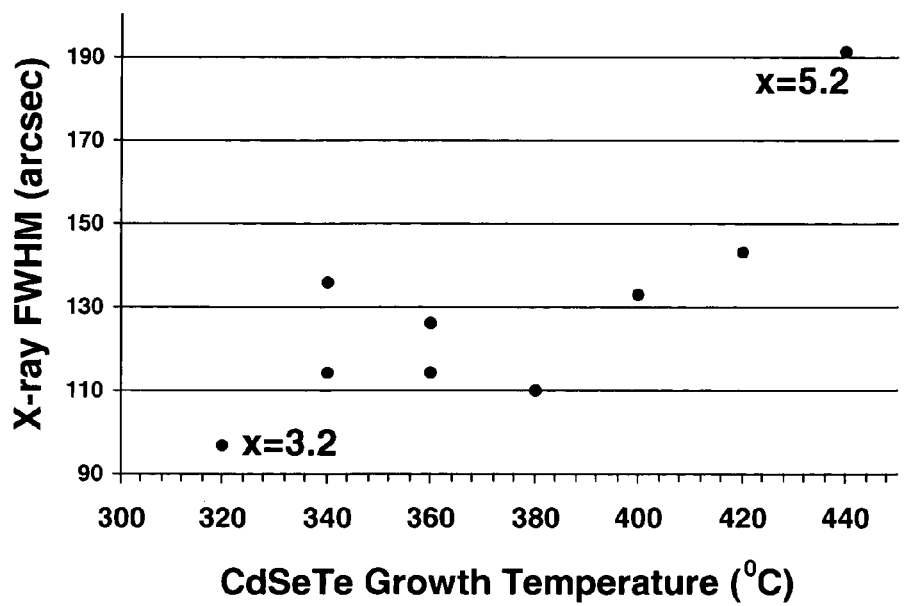
FIG. 2 is a plot of the X-ray FWHMs (full width at half maximums) of CdSeTe layers as a function of CdSeTe growth temperature.

FIG. 2 shows the X-ray FWHM of CdSeTe layer as a function of the CdSeTe growth temperatures. The X-ray FWHM of CdSeTe increases slightly as the growth temperatures increases. These results are shown for x between approximately 0.03 and 0.05.

Figure 3:
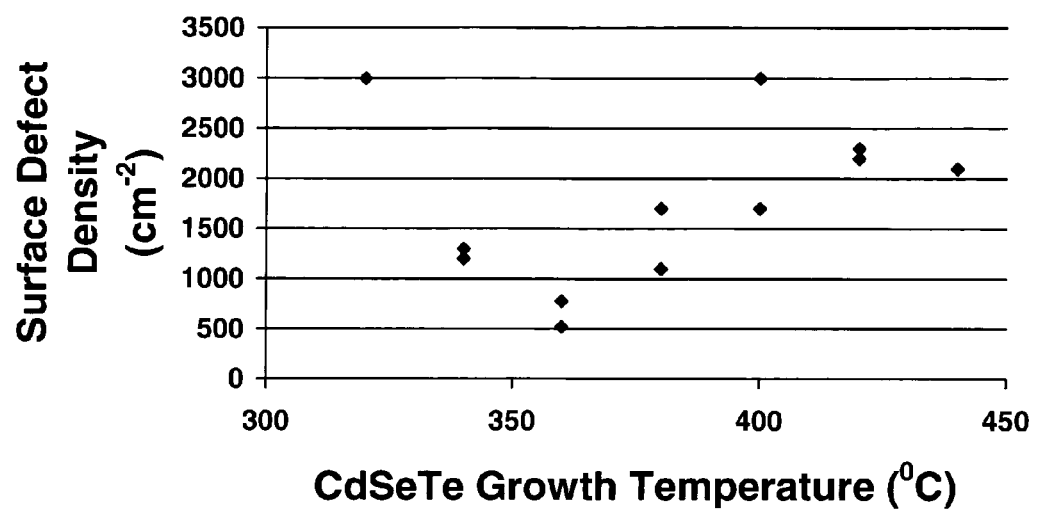
FIG. 3 is a plot of surface defect density of as-gown CdSeTe/Si as a function of CdSeTe growth temperature.

FIG. 3 shows a similar trend in surface defects as a function of the CdSeTe growth temperature. FIG. 3 shows surface defect density of CdSeTe films (per square centimeter) as a function of growth temperature. These results show that for CdSeTe films with x between approximately 0.03 and 0.05 can be grown with a remarkably low level of surface defects, for example below 500 $cm^{-2}$.

Figure 4:
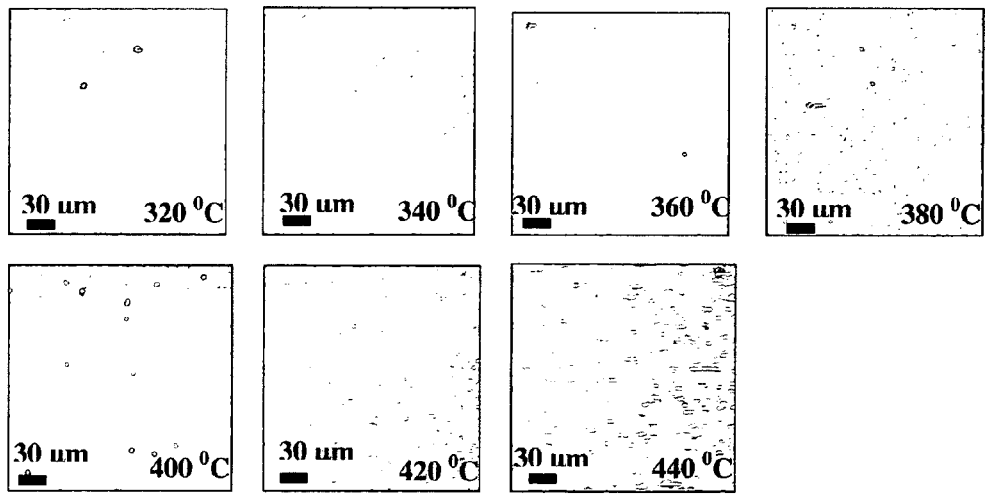
FIG. 4 is a series of micrographs showing the surface morphology of as-grown CdSeTe/Si layers as a function of growth temperatures.

FIG. 4 shows surface morphology as a function of CdSeTe growth temperature. The surface morphology of CdSeTe is quite sensitive to the growth temperature, and becomes significantly rougher as the growth temperature increases. The growth of good CdSeTe layers with the lowest surface roughness is achieved in a growth window of 340-420° C., indicated by the thermocouple reading. More preferably, CdSeTe layers are grown at a lower range of the growth temperatures (340-380' C.).

CdSeTe grown using CdTe+Se fluxes shows that the growth occurs under (Se,Te)-rich conditions. During the growth, Se and Te are believed by non-limiting theory to be in competition for the same nucleation sites. If we assume that all the Cd atoms impinging on the substrate are incorporated, the maximum number of Se and Te atoms incorporated should be equal to the number of Cd atoms, which is proportional to the Cd flux. Since we are using a single CdTe cell to provide Cd and Te flux, we except equal numbers of Cd and Te atoms due to congruent evaporation of the II-VI compound. If we assume total incorporation of incoming Se atoms into the CdSeTe layer, the alloy composition of the ternary compound can be calculated as $x(cal)=\Phi_{Se}/(\Phi_{Se}+\Phi_{Te})_{incorporated}$. Since $(\Phi_{Se}+\Phi_{Te})_{incorporated}=\Phi_{Cd}=\Phi_{CdTe}/2$, therefore, $x(cal)=\Phi_{Se}/\Phi_{Cd}=2\ \Phi_{Se}/\Phi_{CdTe}$, where $\Phi$ is the material flux, measured by a nude ion gauge.

The alloy compositions of many CdSeTe layers measured using X-ray diffraction showed that the measured alloy composition is consistently smaller than the values derived from the Se/Te flux ratio calculation outlined in the preceding paragraph, which indicates that not all of the Se atoms impinging onto the growing layer is incorporated into the film.

CdSeTe is grown on Si using a CdTe compound source and a Se elemental source. It is appreciated that growth is also optionally furnished using CdTe and CdSe compound sources; or Cd, Te, Se elemental sources; or Cd, Te elemental sources and a CdSe compound source.

Figure 5:
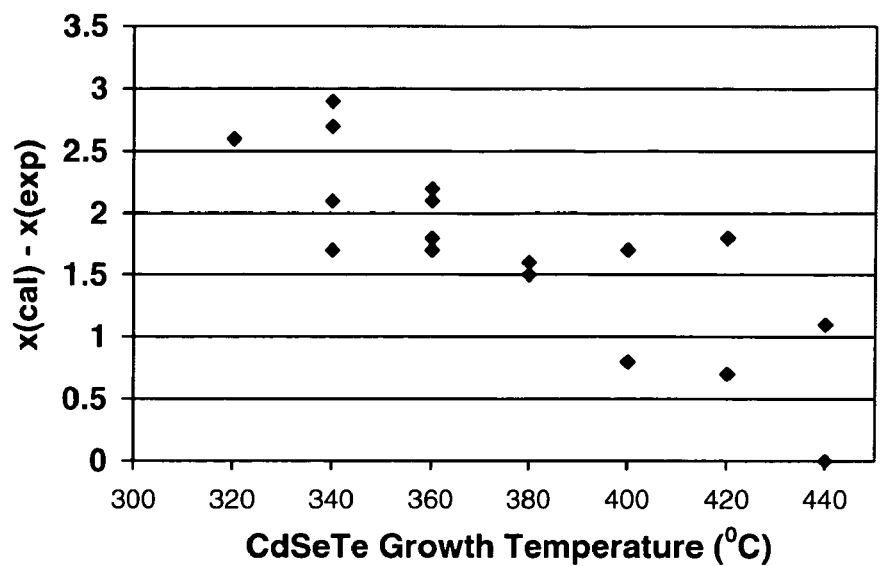
FIG. 5 is a plot of the difference between calculated and measured x values of CdSeTe alloy as a function of growth temperature.

FIG. 5 shows the difference in Se concentration between calculated and experimentally measured values (x(cad)-x (exp)) as a function of growth temperature. Over the entire range of the growth window there exists a difference between calculated and measured values of the CdSeTe alloy. Additionally, this difference is always positive, which implies that not all Se atoms impinging on the CdSeTe surface are incorporated as a result of competition between Te and Se atoms. However, the difference in the calculated and measured x value decreases as the growth temperature increases.

CdSeTe is optionally grown under Cd-rich conditions, and the growth of CdSeTe is monitored as a function of growth temperature. Separate Cd and Te sources are optionally provided as an alternative to the CdTe compound source.

The X-ray FWHM generally increased as the x value of CdSeTe alloy increased. While only 4% of Se is necessary in CdSeTe composite substrate to lattice match to LWIR HgCdTe, other Se contents of the replacement of Se or Te by S are readily adopted to lattice match a variety of ternary materials. The ternary materials illustratively including ZnSeTe, ZnMgSe, CdMnTe, CdMnSe and CdMgTe. The as-grown CdSeTe with 4% Se (i.e. $CdSe_{0.04}Te_{0.96}$) exhibits excellent surface morphology and high crystalline quality.

Figure 6:
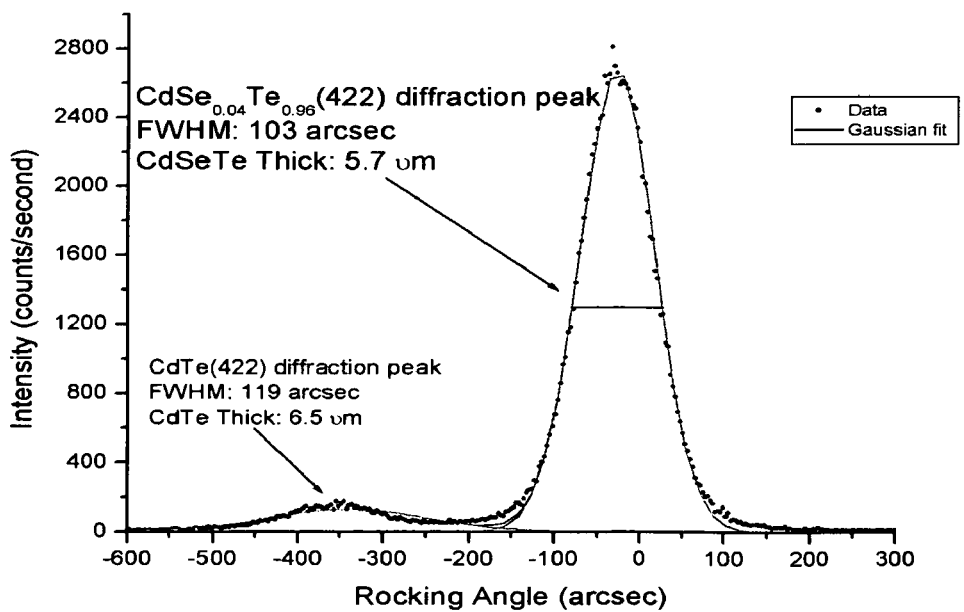
FIG. 6 is an X-ray diffraction rocking curve of a CdSeTe(2 1 1)/CdTe/ZnTe/Si wafer with 4% Se concentration.

FIG. 6 shows an X-ray rocking curve of a 3-in $CdSe_{0.04}Te_{0.69}$/Se layer. The FWHM of a (422) diffraction peak from a 5.7-micron $CdSe_{0.04}Te_{0.96}$ layer is 103 arcsec (the right-hand peak of FIG. 6). This is believed to be the lowest value that has ever been reported for Si based composite substrate lattice matched to LWIR HgCdTe. The left-hand peak shows the CdTe (422) diffraction peak, FWHM of 119 arcsec from the 6.5-micron layer underneath the CdSeTe layer.

Figure 7:
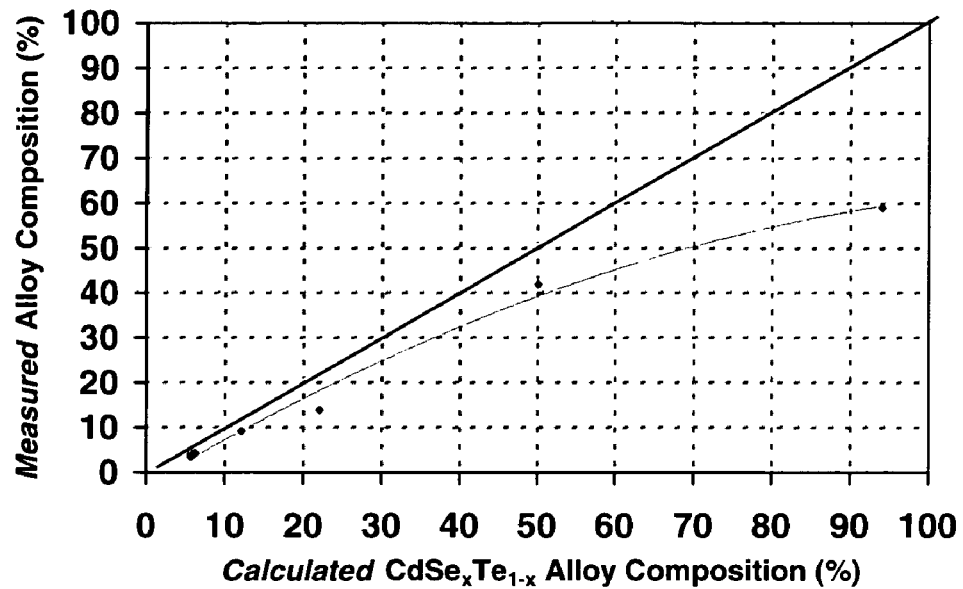
FIG. 7 is a plot of the relationship between calculated alloy compositions based on Se/CdTe BEP (beam equivalent pressure) ratio and measured alloy compositions. The curved line is a guiding trend line and the solid line is the equilibrium line.

FIG. 7 shows the relationship between the calculated Se composition, based on Se:CdTe beam equivalent pressures (BEP) ratio and the measured alloy composition determined by X-ray diffraction. The results indicated that the measured values are always smaller than the calculated values. Furthermore, the deviation increases as the alloy composition increases. The measured alloy composition seems to saturate at approximately 60% when the alloy is grown using only CdTe+Se fluxes, even under Se rich conditions. Using this empirical relationship, one can effectively and advantageously control the alloy composition of CdSeTe by varying the Se:CdTe BEP ratio.

Figure 8:
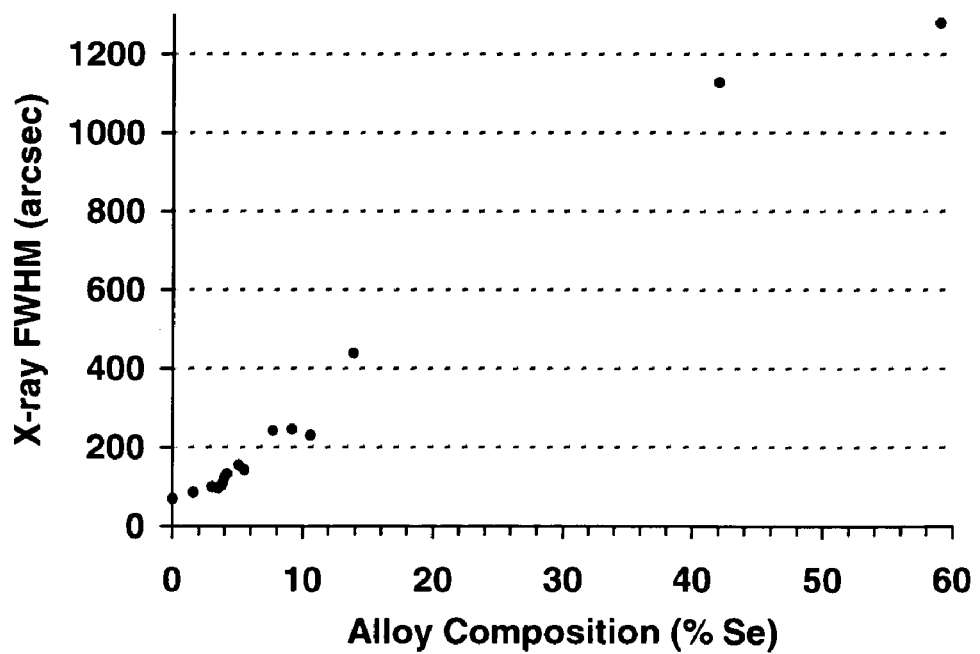
FIG. 8 is a plot of X-ray diffraction FWHMs of CdSeTe/Si layers as a function of alloy composition over a wide composition range.

FIG. 8 illustrates the relationship between the X-ray FWHM of CdSeTe/Si layers and the alloy composition over a wide composition range. The X-ray FWHM of the CdSeTe layers varies from 70 to 230 arcsec as the Se concentration increases from 0 to 10%, respectively. It appears that the alloy disordering is less prevalent in the CdSeTe alloy than in the CdZnTe alloy, indicating that CdSeTe/Si provides an improved composite substrate for HgCdTe. Furthermore, broadening of the X-ray FWHM does not substantially occur until the composition reaches 4%. Since only 4% Se is needed to lattice match CdSeTe to LWIR HgCdTe, alloy disorder is a negligible effect in producing composite substrates.

Figure 9:
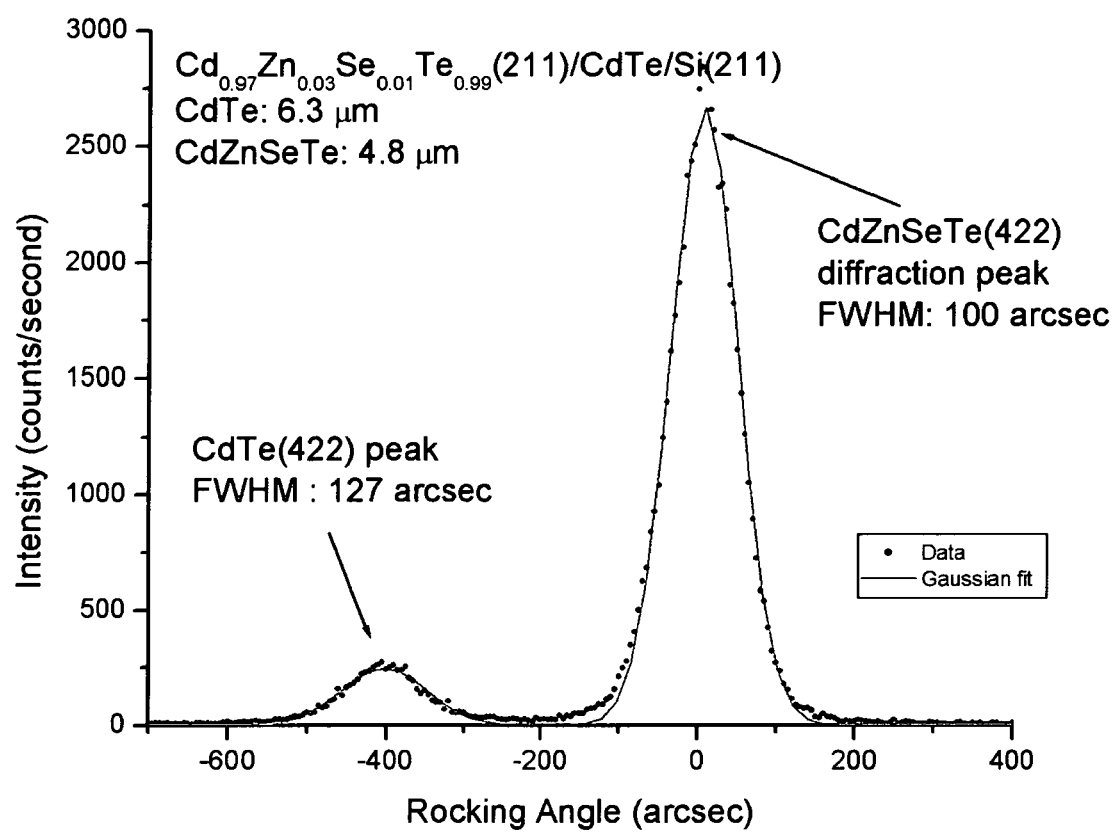
FIG. 9 is an X-ray rocking curve of $Cd_{0.97}Zn_{0.03}Se_{0.01}Te_{0.99}$ grown on silicon.

FIG. 9 shows an X-ray rocking curve of a 3-in $Cd_{0.97}Zn_{0.03}Se_{0.01}Te_{0.99}$/Si layer. The FWHM of a (422) diffraction peak from a 4.8-micron $Cd_{0.97}Zn_{0.03}Se_{0.01}Te_{0.99}$ layer is 100 arcsec (the right-hand peak of FIG. 9), which is quite comparable to the value of $CdSe_{0.04}Te_{0.96}$/Si layer. The X-ray FWHMs of CdSeTe and CdZnSeTe are believed to be the lowest values that have ever been reported for Si based composite substrate lattice matched to LWIR HgCdTe. The left-hand peak shows the CdTe (422) diffraction peak, FWHM of 127 arcsec from the 6.3-micron layer underneath the CdSeTe layer.

Figure 10:
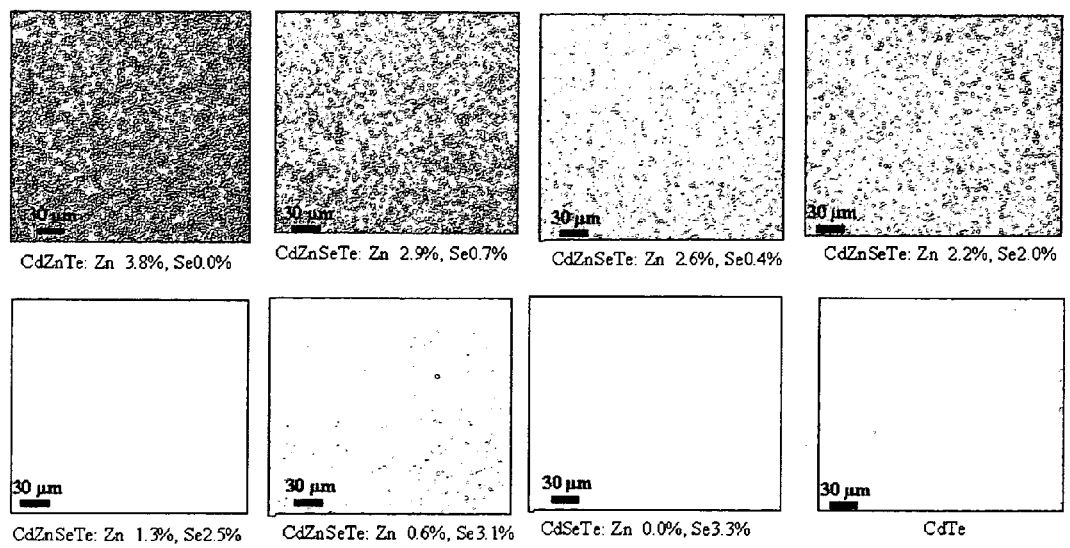
FIG. 10 is a series of micrographs showing the surface morphology of as-grown $Cd_{1-z}Zn_zSe_xTe_{1-x}$ in which z and x values vary from z=0.04, x=0.04, z=0.

FIG. 10 shows surface morphology of $Cd_{1-z}Zn_zSe_xTe_{1-x}$/Se layers as a function of Zn (z) and Se (x) concentrations while maintaining total alloy concentration (z+x) equal to 0.04. As seen in the figure, the surface morphology of CdZnSeTe is quite sensitive to the Zn concentration, and becomes significantly rougher as the Zn concentration increases. The growth of CdZnSeTe layers with smooth surface is achieved at low Zn concentration. More preferably, CdZnSeTe layers are grown with Zn concentration ranging from 0.005 to 0.015.

Figure 11:
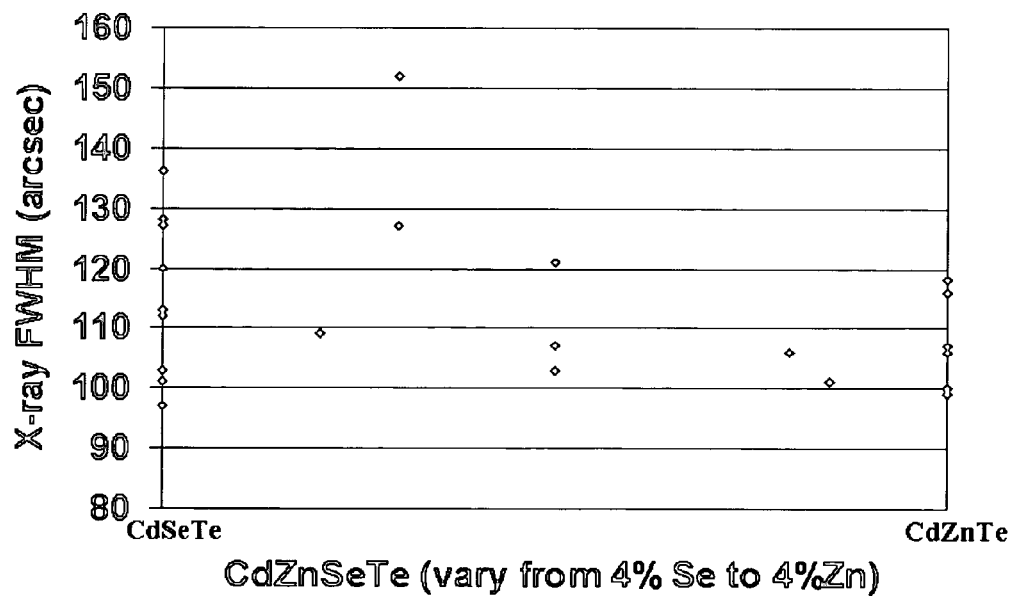
FIG. 11 is a plot of the X-ray diffraction FWHMs of $Cd_{1-z}Zn_zSe_xTe_{1-x}$ as a function x and z where x+z is held constant at 0.04.

FIG. 11 shows the X-ray FWHM of CdZnSeTe layer as a function of the Zn and Se concentrations when the sum of Zn and Se concentration is maintained near 4%. The X-ray FWHM of CdZnSeTe is nearly invariant.

Figure 12:
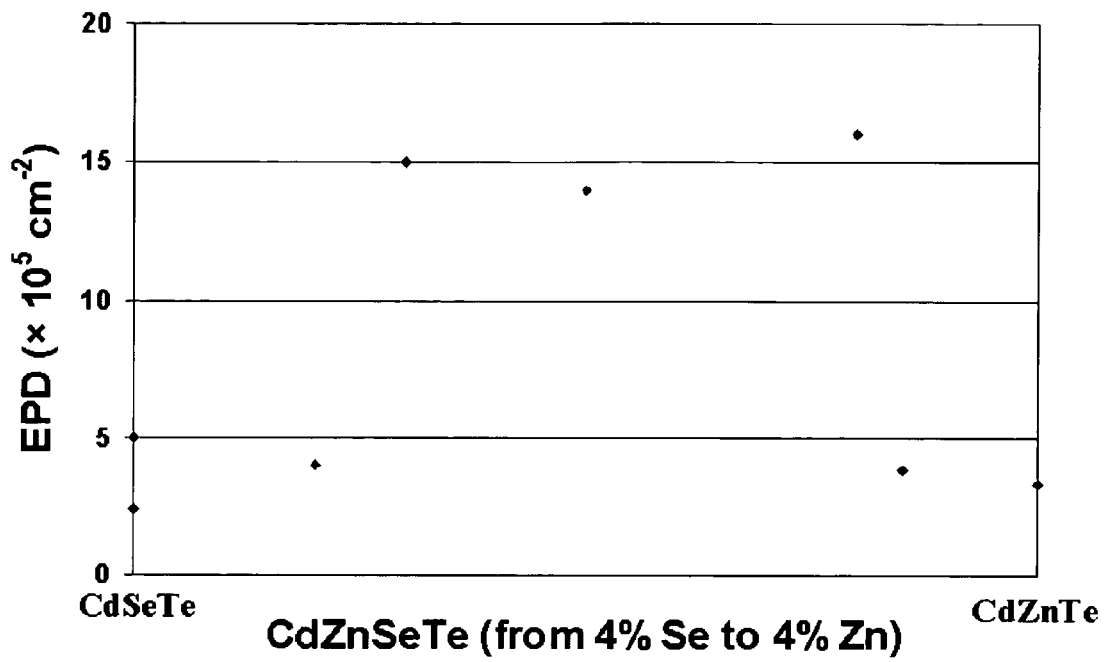
FIG. 12 is a plot of dislocation density in $Cd_{1-z}Zn_zSe_xTe_{1-x}$/Si(2 1 1) as a function of x and z where x+z is held constant at 0.04.

FIG. 12 shows the dislocation density on CdZnSeTe/Si as a function of Zn and Se concentrations. As seen in the figure, a significant increase of the dislocation density occurs when Zn and/or Se concentration approaches 2%. Low Zn or low Se CdZnSeTe/Si layers exhibit a dislocation density comparable to CdZnTe/Si, CdSeTe/Si and CdTe/Si layers. Of special interest are CdZnSeTe/Si layers with low Zn concentration and pure CdSeTe/Si layers, which exhibits both excellent surface morphology and low dislocation density.

Figure 13:
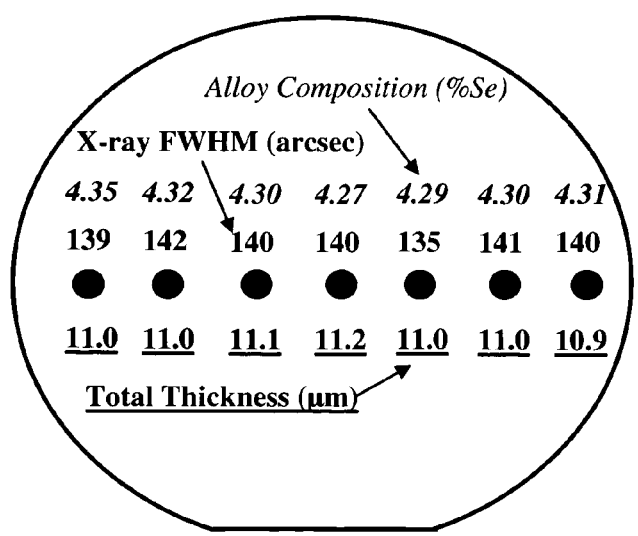
FIG. 13 is a point-by-point lateral measurement of film thickness, X-ray diffraction FWHM and alloy composition of a 3-inch CdSeTe/Si wafer.

The CdSeTe and CdZnSeTe/Si composite substrates provide low cost, large size substrates for large-format HgCdTe focal plane arrays (FPAs). One of the key parameters for the large-format FPAs is the lateral uniformity of the detector material properties. FIG. 13 shows lines scans across a 3-inch CdSeTe/Si wafer to determine layer thickness, alloy composition and X-ray FWHM. The scans are performed manually through a point-by-point measurement. Since the 3-inch CdSeTe wafer is grown with substrate rotation throughout the growth process, radial uniformity is representative of lateral surface uniformity. The results indicate that 3-inch CdSeTe/Si wafer grown by MBE exhibit excellent overall uniformity.

The inventive CdSeTe and CdZnSeTe films also had a low film dislocation density. A conventional Everson solution (W. J. Everson et al., J. Electronic Matls. 24(5), 1995, pp. 505-510) is used to etch four 4% CdSeTe/Si and CdZnSeTe samples. As a comparison, one CdTe/Si sample (X-ray FWHM of 56 arcsec) is also etched. Well-defined etched pits are observed on all CdSeTe and CdZnSeTe samples and the reference CdTe sample. The etch pit density (EPD) value for each sample is averaged over four sampling areas to improve accuracy. The EPD values for the best 4% CdSeTe/Si, CdZnSeTe/Si and the reference CdTe/Si sample are $1.4 \times 10^5$ $cm^{-2}$, $4 \times 10^5$ $cm^{-2}$ and $1.0 \times 10^5$ $cm^{-2}$, respectively. Although the difference of X-ray FWHM values between CdTe and CdSeTe is about 50 arcsec, the EPD values are comparable. This further illustrates suitability of CdSeTe/Si and CdZnSeTe/Si as lattice-matching composite substrates for LWIR HgCdTe.

The $CdSe_xTe_{1-x}$/Si and $Cd_{1-z}Zn_zSe_xTe_{1-x}$/Si structures provide silicon based composite substrates, which can be made to lattice-match to HgCdTe films grown thereon for improved LWIR devices. In addition to its possible application for LWIR HgCdTe, II-VI compounds belonging to the cadmium chalcogenide family are now operative as X-ray and gamma-ray detectors.

CdSeTe and CdZnSeTe films according to the present invention are operative in a variety of improved radiation detectors, such as microwave, millimeter-wave, IR, visible, UV, X-ray, or gamma ray detectors. For example, an improved radiation detector includes a silicon based substrate, a CdSeTe or CdZnSeTe film grown on the silicon based composite substrate, and a radiation-sensing layer grown on the CdSeTe or CdZnSeTe layer. The radiation sensing layer is optionally a HgCdTe layer which is substantially lattice matched to the CdSeTe or CdZnSeTe, so that effects of any actual lattice mismatch are insignificant to device performance. For example, an improved detector can include a $Hg_{1-y}Cd_yTe$ layer grown on a $CdSe_xTe_{1-x}$ or $Cd_{1-x}Zn_zSe_xTe_{1-x}$ film, where x or z+x is between 0.01 and 0.08 (such as approximately 0.04). Preferably, x or z+x is between 0.03 and 0.05. Most preferably, y is between 0.15 and 0.30. Preferably, y is about 0.22.

CdSeTe and CdZnSeTe films according to the present invention are readily grown directly on passivated silicon films, or on silicon films supporting one or more other II-VI films, such as other cadmium chalcogenides grown on Si.

Electronic configurations for such improved detectors are well known in the detector arts. For example, device configurations and readout circuitry which may be adapted to embodiments of the present invention are described in U.S. Pat. Nos. 5,264,699 to Barton et al.; U.S. Pat. No. 5,432,374 to Norton and U.S. Pat. No. 6,420,710 to Verger et al., and references therein. CdSeTe and CdZnSeTe films according to the present invention are recognized to be operative in other applications such as in other optoelectronic devices, such as solar cells, photo detectors, light emitting diodes, lasers, and the like.

Any patents or publications mentioned in the specification are indicative of the levels of those skilled in the art to which the invention pertains. These patents and publications are herein incorporated by reference to the same extent as if each individual patent or publication was specifically and individually indicated to be incorporated by reference.

The preceding figures and description illustrate the general principles of the present invention and some specific embodiments thereof. These are not intended to be a limitation upon the practice of the present invention since numerous modifications and variations will be readily apparent to one skilled in the art upon consideration of the drawings and description. The following claims, including all equivalents thereof, are intended to define the scope of the invention.

Having described our invention, we claim:

1. A multilayer structure for use in a device for detection of microwave, millimeter, infrared (IR), ultraviolet, X-ray or gamma radiation comprising:
    a silicon based substrate; and
    an epitaxial $Cd_{1-z}Zn_zX_xX'_{1-x}$ film grown on the silicon based substrate by molecular beam epitaxy from multiple material sources where the flux of each of the multiple material sources is controlled under a given set of epitaxial growth conditions including temperature, where X is a chalcogenide selected from the group consisting of S and Se; X' is a higher atomic number chalcogenide relative to X and X' is selected from the group consisting of S, Se and Te; x is a number greater than zero and less than or equal to 0.097; and z is a number greater than or equal to 0.003 and less than or equal to 0.02, such that x+z is a value less than or equal to 0.10; a radiation sensing $Hg_{1-y}Cd_yTe$ layer grown on the $Cd_{1-z}Zn_zX_xX'_{1-x}$ film, the $Hg_{1-y}Cd_yTe$ layer being substantially lattice matched to the $Cd_{1-z}Zn_zX_xX'_{1-x}$ film, where y is a number between 0.15 and 0.35 such that the effects of any mismatch are insignificant to device performance and the surface defect density is less than 500 per centimeter squared.

2. The multilayer structure of claim 1, wherein X is Se and X' is Te, and wherein the concentration of Zn and Se approaches two percent and x+z approaches 0.04 and the epitaxial layer is grown by substrate rotation throughout the growth process to produce lateral surface uniformity and low film dislocation density.

3. The multilayer structure of claim 2, wherein y is between 0.15 and 0.30, and wherein the radiation sensing layer senses IR radiation.

4. The multilayer structure of claim 1 wherein the structure is used for the detection of long wavelength IR, x+z is between 0.01 and 0.08 and y is approximately 0.22.

5. The multilayer structure of claim 4 wherein X is Se and X' is Te.

6. The multilayer structure of claim 1 wherein the epitaxial $Cd_{1-z}Zn_zX_xX'_{1-x}$ film is a $Cd_{.97}Zn_{.03}Se_{.01}Te_{.99}$ film grown on a single crystal silicon (2 1 1) oriented based substrate, and wherein the radiation sensing $Hg_{1-y}Cd_yTe$ layer is a $Hg_{.78}Cd_{.22}Te$ layer.

7. The multilayer structure of claim 6 wherein $Cd_{.97}Zn_{.03}Se_{.01}Te_{.99}$ film is grown on the single crystal silicon (2 1 1) oriented based substrate utilizing the CdTe (2 1 1) B face.

8. The multilayer structure of claim 1 wherein the epitaxial $Cd_{1-x}Zn_zX_xX'_{1-x}$ film is a $Cd_{1-z}Zn_zSe_xTe_{1-x}$ film.

9. The multilayer structure of claim 8, wherein x+z is between 0.03 and 0.08 and y varies within a range of approximately 0.2 for long wavelength IR (LWIR) to a value of 0.4 for short wavelength IR.

10. A $Cd_{1-z}Zn_zSe_xTe_{1-x}$ film grown by molecular beam epitaxy on a silicon based substrate, where x is a number between zero and one inclusive and z is greater than zero and less than or equal to 0.02; having an overlayer of $Hg_{1-y}Cd_yTe$ thereon for the detection of infrared (IR) radiation, wherein the $Cd_{1-x}Zn_zSe_xTe_{1-x}$ film is substantially lattice matched to the overlayer of $Hg_{1-y}Cd_yTe$.

11. The film of claim 10, wherein x+z is between 0.03 and 0.08 and y varies within a range of approximately 0.2 for long wavelength IR (LWIR) to a value of 0.4 for short wavelength IR.

12. A $Cd_{.97}Zn_{.03}Se_{.01}Te_{.99}$ film grown on a single crystal silicon (2 1 1) oriented based substrate, having an overlayer of $Hg_{.78}Cd_{.22}Te$ thereon, wherein the growth of the $Cd_{.97}Zn_{.03}Se_{.01}Te_{.99}$ film is substantially lattice matched to the overlayer of $Hg_{.78}Cd_{.22}Te$.

13. The $Cd_{.97}Zn_{.03}Se_{.01}Te_{.99}$ film grown on a single crystal silicon (2 1 1) oriented based substrate recited in claim 12, where the $Cd_{.97}Zn_{.03}Se_{.01}Te_{.99}$ film is grown on the single crystal silicon (2 1 1) oriented based substrate utilizing CdTe (2 1 1) B face.

* * * * *